United States Patent [19]
Klemm

[11] 3,934,504
[45] *Jan. 27, 1976

[54] METHOD FOR PHOTO-MECHANICAL COMPOSITION OF DESIGNS ON STENCILS FOR FILM AND SCREEN PRINTING, PARTICULARLY ROTARY SCREEN PRINTING

[75] Inventor: Martin Klemm, Gerlafingen, Switzerland

[73] Assignee: Fritz Buser AG., Maschinenfabrik, Wiler b. Utzenstrof, Switzerland

[ * ] Notice: The portion of the term of this patent subsequent to Sept. 17, 1991, has been disclaimed.

[22] Filed: Apr. 4, 1974

[21] Appl. No.: 457,871

Related U.S. Application Data

[63] Continuation of Ser. No. 241,609, April 6, 1972.

[30] Foreign Application Priority Data

Apr. 13, 1971 Switzerland.......................... 5265/71
Aug. 3, 1971 Switzerland........................ 11432/71
June 21, 1971 Switzerland.......................... 9055/71

[52] U.S. Cl................................ 101/128.3; 96/36.4
[51] Int. Cl.²...................... B41N 1/24; G03C 5/00
[58] Field of Search.................... 96/36.4; 101/128.3

[56] References Cited
UNITED STATES PATENTS

| | | | |
|---|---|---|---|
| 734,120 | 7/1903 | Deeks............................. | 101/128.2 |
| 2,064,764 | 12/1936 | Playford et al. ................. | 101/128.3 |
| 2,131,225 | 9/1938 | Kirch et al....................... | 101/128.3 |
| 2,370,874 | 3/1945 | Playford.......................... | 101/128.3 |
| 2,592,789 | 4/1952 | Brennan............................ | 101/128.3 |
| 3,532,052 | 10/1970 | Erickson........................... | 96/36.4 |

*Primary Examiner*—David Klein
*Attorney, Agent, or Firm*—Flynn and Frishauf

[57] ABSTRACT

To improve the detail on screen printing, in which images are applied to a printing grid or screen in which a photo-sensitive layer is utilized to be exposed in accordance with the image or composition to be printed, and the non-exposed image portions are removed before printing, the screen is pre-processed to provide it with a smooth surface so that the photo-sensitive layer can, itself, be applied on the screen with a smooth surface of uniform and controllable thickness directly over the printing grid; in a preferred form, the interstices of the printing grid or screen are filled with a filler, and the surface of the grid and the filler is then treated to remove that portion of the filler which is above the grid elements, leaving the filler within the interstices, and a smooth surface over which the photo-sensitive layer can be applied. A plurality of such applications can be made, the photo-sensitive surface itself being exposed to form a lattice screen, which is treated to provide a smooth surface on which a further photo-sensitive layer which is to be exposed with the image, can then be applied.

6 Claims, 14 Drawing Figures

METHOD FOR PHOTO-MECHANICAL COMPOSITION OF DESIGNS ON STENCILS FOR FILM AND SCREEN PRINTING, PARTICULARLY ROTARY SCREEN PRINTING

This is a continuation of application Ser. No. 241,609, filed Apr. 6, 1972.

The present invention relates to a method of photo-mechanically composing the pattern to be applied on screens or grids for film and screen printing, and more particularly for rotary screen printing, in which a light-sensitive layer is removed in accordance with an image which is exposed on the photo-sensitive layer.

The term "composition" of an image on the screen, for purposes of the present application, is to be so interpreted that the screen will have a pattern thereon which consists of open or closed interstices or spaces between the meshes of the screen, in accordance with the image to be reproduced. Screens or grids of this type may be used to print on various materials, such as textiles, paper or the like.

Rotary film printing is a special process of the more generally known film or screen printing, in which screens or sieves in form of a hollow cylindrical stencil are used. The method of composition utilized is principally a galvanic composition process in which the sieve-like portions of a hollow, cylindrical round stencil are first galvanically built up in one operation, and then coated in which the galvanically produced sieve, grid, or screen is covered with a photo-sensitive plastic layer, or paint coating which is removed, in the course of the further process steps, at areas determined by the image to be reproduced. In those portions which are not to be printed, the coating remains; in the portions which are to be printed, the layer or coating of the photo-sensitive material is removed. For a general discussion of this process, reference is made to "The Way Things Work", Simon and Schuster, 1967.

The present invention relates to the screen or grid printing method in which a photo-sensitive coating is removed from the screen where printing is to be carried out, and is left on the screen where no print is to be made. In spite of the high state of the art in this field, the method has some disadvantages, one of them being that the sharpness of reproduction is not as high as might be desired — see also comment in the above referred to literature reference. It has been found that the lack of sharpness or accuracy in reproduction is due to a step, or sawtooth-like edge at the ends or terminal limits of the figures; this has led to the concept of sawtooth edge formation, or distortion in connection with lack of sharpness of reproduction in this process. To a certain extent, this undesirable effect can be reduced by printing manipulation and handling; however, some distortion and lack of sharpness has been accepted in this field as a disadvantage which cannot be avoided.

It is an object of the present invention to provide a method of photo-mechanical composing of matrices for use in rotary printing in which the lack of sharpness, and particularly the so-called sawtooth distortion at the edges of portions to be printed is eliminated or at least reduced to be completely unnoticeable.

SUBJECT MATTER OF THE PRESENT INVENTION

Briefly, the photo-sensitive layer is applied to the underlying screen or grid as a surface having constant and controllable thickness of its layer when applied to the grid stencil. In accordance with an embodiment of the invention, the interstices between the grid are first filled with a material which can be later on removed, the filler and the surface of the grid then being prepared to have a uniform top surface so that the photo-sensitive layer to be applied thereover likewise will have a smooth surface of controlled and uniform thickness.

The invention will be described by way of example with reference to the accompanying drawings, wherein.

Figure 1:
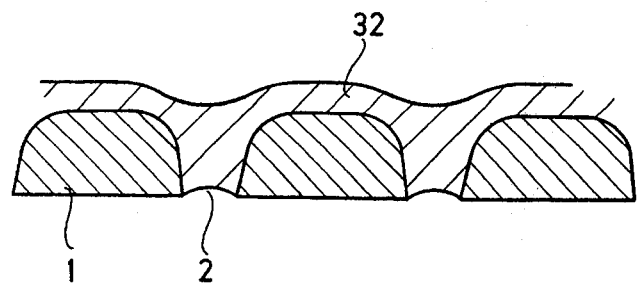
FIGS. 1 to 5 and FIG. 7 illustrate various steps in the composition of the image to be screen-printed.

The formation of unsharp edges, that is, the sawtooth formation is believed to be due to the interaction of two causes.

After drying, or polymerization of the emulsion layer, it has been noted that the layer has a clearly defined top wavy layer, or undulating surface, entirely independent of the type of photographic emulsion which is being used. This waviness or undulation appears to be due to the usually used rubber doctor blades during application of the photo-sensitive emulsion. In connection with this technology, more emulsion is applied in the interstices between the grids of the screen than on top of the grid elements themselves. The still soft and deformable emulsion may be smooth; upon the subsequent following physical drying step, however, the surface will become wavy since those areas which have a greater volume of emulsion, that is, between the interstices, will shrink more than the ones which are thin.

These zones, after drying no longer flat, are then exposed through a negative, or through a slide. The light penetrates under various angles into the emulsion layer and, within the layer, is diffused in various directions. It is thus basically impossible to provide an edge of the image which is three-dimensionally congruent with the negative, or projected image from a slide, within the emulsion layer. This rather theoretical fact becomes material in actual practice since exactly in the interstice or opening of the rasters at which, for reasons of printing technology the highest accuracy in imaging is required, the greatest volume of underlying layer is present, resulting as above noted, in the greatest inaccuracy of imaging. Thus, if a raster opening is not penetrated by light, that is, is imaged from a light impervious or opaque portion of the negative, that is, if a bridge across the interstice would be formed, a complete closure of this opening will result. Thus, the edge of the image does not follow the theoretical or ideal line of the negative but the various intersticial openings of the rotary matrix and thus the raster formation at the edge of the image.

Even if it would be possible to use collimated or parallel light for imaging, the desired ideal projection would not be achieved. Concomitantly, the bridging of the raster openings by the emulsion would result. The sawtooth effect in printing would, however, still be visible (as can be seen, for example, in rotary matrices of low mesh number). Thw waviness of the emulsion layer does not permit best optimal contact at the crossover points of the raster openings between the emulsion layer and the substrate. This leads to an excess amount of printing ink, and flooding at the edge of the figure in the region of just these raster openings, so that the raster opening prints as if it would be completely open.

The sawtooth effect is due to two causes. The waviness of the emulsion does not permit accurate and adequate imaging of the negative, or slide to be projected, even if customary technology permits some bridging of the interstices; the waviness does not permit a tight sealing between the emulsion surface and the substrate. Further, the interaction of the non-uniform emulsion layers and the inclined, or non-parallel projection with non-collimated light — as is customary, does not permit a sharp congruent imaging of the negative during exposure.

Within the region of the screen printing with flat matrices, the referred to sawtooth effect can be avoided by forming a so-called printing shoulder. In accordance therewith, the edge of the image which is not to be printed is formed slightly raised. The angle at the edge of the image should be as close to a right angle as possible, and should be sharp, so that rounded corners are avoided, if at all possible. The raised, non-printing portion of the matrix should be capable of closely contacting the material to be printed, such as a paper sheet, or textile material. This, then, results in optimum sealing between the portion on which printing is to be carried out, and the non-printing portion with respect to the printing ink which, as above referred to, is not usually possible in the customary composing system for rotary stencils. When printing flat, various methods which are well known have been proposed — the pure indirect methods, such as cut film, (pigmented paper methods) and the like; pure direct methods such as additional layering, Supernylonsol process (trademark) and the like, and mixed systems in which the pure direct method and the pure indirect method are mixed, that is so-called combined processes. All these methods and processes can be used with a printing edge, or printing projection and permit printing without the sawtooth distortion. The disadvantage, however, resides that layers are produced which have low adhesion to the grid or mesh, or screen and have low chemical and mechanical stability as is necessary for rotary screen printing and permit only shallow screens to be applied to the printing cylinders. The specific loading of the stencil in rotary printing is substantially higher than in flat printing so that use of the above referred to processes is not possible even if the cylinders, and the stencils are not of large size. In order to compose images on rotary stencils, emulsions have been developed which meet the requirements with respect to loading which, however, since used in direct processes which do not permit additional layering, result in the aforementioned sawtooth formation.

It is thus an object of the invention to avoid the disadvantages of the prior art, while being able to use the characteristic advantages of the methods referred to which are known within the technology of the flat screen printing, that is, which utilize a precise printing shoulder or raised section, and still utilize a direct system in which a high strength emulsion can be utilized.

Referring now to the drawings and particularly to the series of FIGS. 1 to 7, in which the process is described, and contrasted with that of the prior art.

A screen surface, such as a cylindrical stencil is coated with a layer 32 which can be dissolved in a known solvent, such as a filler lacquer (FIG. 1). The screen itself is shown schematically in cross section, and has grid or mesh lines 1 separated by raster or grid interstices 2 therebetween.

Figure 2:
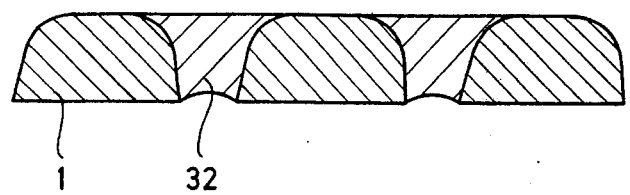
Figure 3:
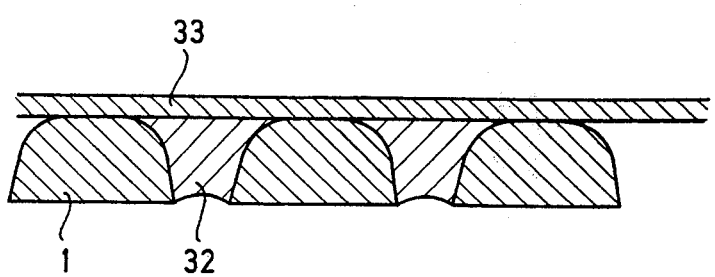
Figure 4:
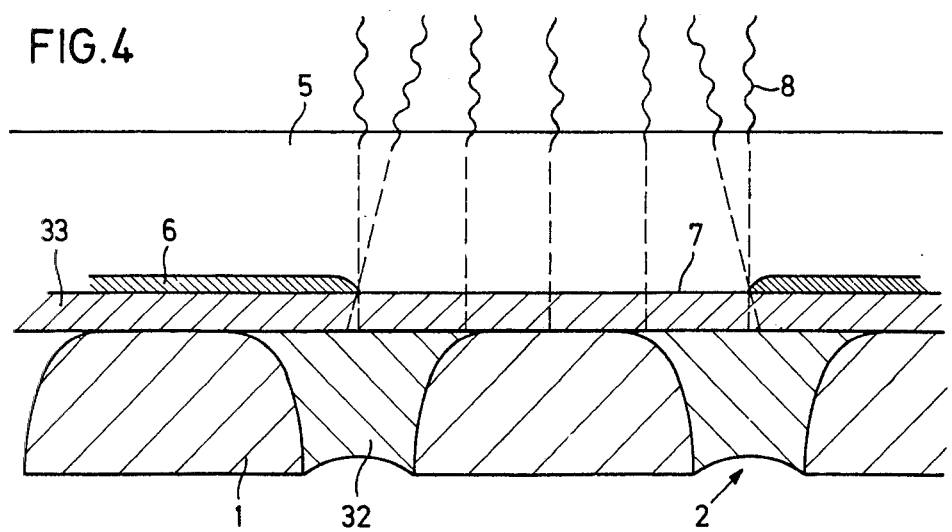

The surface of the screen, coated with the lacquer 32 is then buffed or ground so that the grid surfaces, at their top, are freed from the lacquer 32, the interstices, however, remaining filled to form a composite, level, smooth continuous surface — see FIG. 2. FIG. 3 illustrates the next step, in which a photo-sensitive layer 33 is applied over the ground and smooth surface formed of the combination of grid or mesh elements 1 and the filled interstices 32. Layer 33 is dried, as customary. As schematically indicated in FIG. 4, a negative 5 is then exposed by light beams 8. Negative 5 has transparent regions 7 and opaque regions 6.

Figure 5:
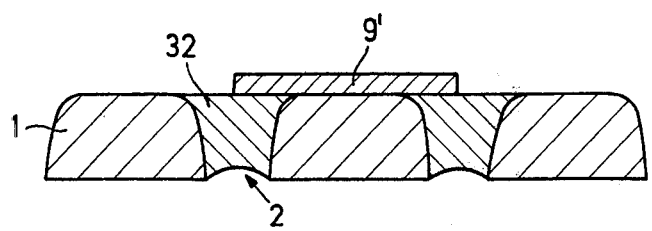

After exposure, the layer 33 is developed — see FIG. 5 — and the exposed non-soluble regions 9' will remain on the surface of the screen. Comparing FIGS. 4 and 5, it will be seen that the light beams 8 which penetrate under various angles cannot have deforming effects at the edge of the transition region between a grid and a grid interstice, since the layer 33 is of uniform thickness, and, further, the thickness of layer 33 can be held at a predetermined desired thickness with respect to the width of the raster interstice 2. Thus, the previously referred to three-dimensional imaging or composing process is controlled. The formation of the so-called printing shoulder can also be effected, permitting optimal sealing between printing and non-printing regions or zones.

Figure 6A:
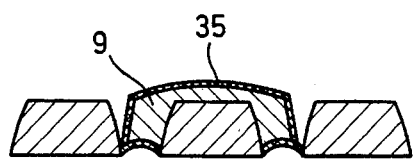
FIG. 6a illustrates an intermediate step or result in accordance with the prior art.
Figure 6B:
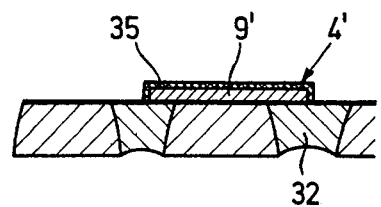
FIG. 6b the same step in accordance with the present invention.

The remaining, photo-sensitive and exposed layer 9' is dried and polymerized. This layer will shrink. Referring to FIG. 6a, which shows this step in accordance with the prior art in which the interstices 2 do not have a filler 32, it will be seen that the shrunk region 9 has a shrinking zone 35. Comparing FIG. 6a with FIG. 6b, where the method in accordance with the present invention is illustrated, it will be seen that the photosensitive layer in known composing method shrinks three-dimensionally, and, further, that the deformation process due to the shrinking of the emulsion layer is enhanced. In contrast, the emulsion layer 9' (FIG. 6b — present invention) can shrink essentially only in a two-dimensional direction, that is, sideways of the top surface layer formed by the grid 1 and the filler 32, as illustrated at 35', since that portion of the emulsion 9' which overlies an intersticial area, as seen at 4', will be supported from below by the layer 32. Thus, vertical (with respect to FIG. 6a or 6b) shrinkage of the exposed portion, as illustrated in FIG. 6a is not possible in accordance with the present invention.

Figure 7:
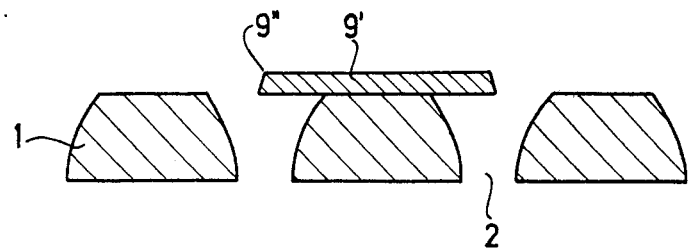

After polymerizing, an additional step is carried out in accordance with the present invention, namely removal of the filler material 32 — see FIG. 7. The polymerized layer 9' is chemically highly stable and it has been found from experience that the usual solvents to remove the layer 32 do not affect photo-sensitive layer 9'. The printing shoulder 9'' is flush with the top surface of the layer 9'. Only photo-sensitive material is removed from the layer 33 in the developing step, to leave the exposed and later polymerized photo-sensitive portions 9'. The filler material is later removed in a removal step which does not affect the remaining portions 9' of the photo-sensitive material.

The process in accordance with the present invention provides for edges of the figures which are free of sawtooth formation. Not only is it possible to provide sharper reproduction, but fine detail, with fine lines can be reproduced which was not heretofore possible.

The process in accordance with the present invention can also be used to reproduce half tones. The image to be composed is photographically broken into a line raster, for example, by a grid, a dot pattern or the like, which is utilized in the form of a screen, or the like upon exposure of the image.

In usually known composing methods for rotary stencils, the width of the smallest line which can be composed and readily printed, by experience, extends between two interstices and one grid line. It can readily be seen that the width of the line depends on the fineness of the mesh of the screen of the stencil. In other words, coarse rasters, if used, permit only wide lines, and fine rasters permit thin lines. In accordance with the present invention, the width of the line need only have the width of one of the grid lines themselves, measured at the outer edge of the stencil.

Figure 8:
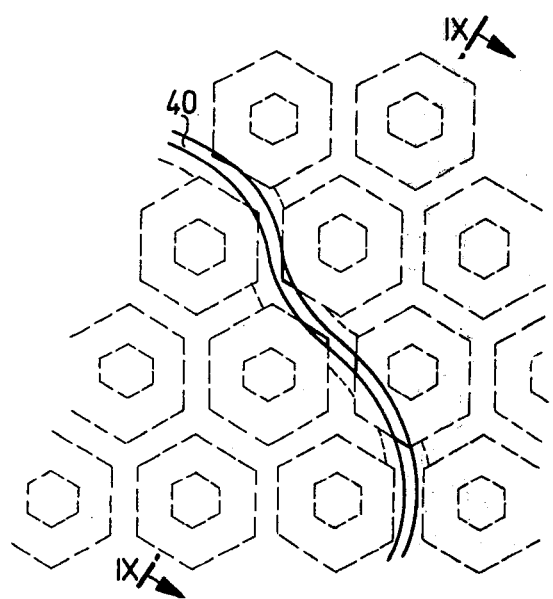
FIG. 8 is a schematic representation of a method used to reproduce a fine line.
Figure 9:
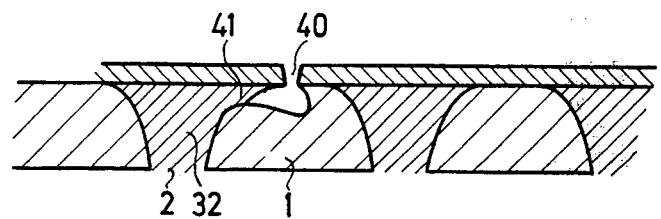
FIG. 9 is a cross section along line IX—IX of FIG. 8.

In order to be able to compose even smaller lines and to print these smaller lines, which are essentially independent of the fineness of the raster and the stencil, the method can be modified, as explained particularly in connection with FIGS. 8 and 9.

Let is be assumed that the grid has been filled with a filler substance, and then ground to form a smooth surface, to which a photo-sensitive layer was applied which is thereafter exposed, in other words, that the steps in connection with FIGS. 1 to 5 have been done. The line which is formed after washing and drying is indicated in FIG. 8 at 40 which, as is clearly apparent, is less wide than the width of a screen element 1. In those cases in which the line falls congruent with a raster grid, a direct connection between a raster intersticial space is not provided, which provides for poor inking, and poor printing such a point.

In accordance with a feature of the invention, a communication can be provided with the stencil after the polymerizing step of the photo-sensitive layer has been carried out, but before the material 32, filling the intersticial spaces, has been removed or dissolved. Before such dissolving, the exposed stencil is etched, but only from the side of the grid at which the polymerized emulsion is placed. An etch bath is selected which has high lateral etching effects, but low depth etching. The filler substance which, during the etching step, is located only in the intersticial spaces between the grid lines permits application of the etch material only to those points where it is needed, that is, where it can etch away some of the grid lines, where required, which contributes to the stability of the entire stencil. The etching process is terminated when openings 41 (FIG. 9) are formed by removal of some material from the grid 1, that is, beneath or between the imaged line 40 and the respective adjacent raster opening 2 which, at that stage of the process, is still filled with the material 32.

After termination of etching, the filler substance 32 is dissolved or washed out, and the stencil is ready for printing.

The usual grid material for rotary screens utilizes nickel — almost exclusively — and thus iron chloride, in an acqueous solution is a good etch substance.

If the mesh openings are wide, that is, if the raster is quite coarse, such as 40 or 60 mesh, or if thick emulsions are to be used in the printing, then high requirements are placed on the strength and sturdiness of the emulsion layer, due to the large bridges of emulsion over the raster openings. To obtain error-free printing also in such a case, and in spite of the high mechanical loading, the inner side of the stencil, ready for printing, may have a lacquer applied thereto which, immediately after application and while still somewhat flowable, is removed from the emulsion side of the stencil by suction. After a suitable drying, that is, after chemical hardening, the emulsion layer is reinforced on the side which does not print, without interfering with the quality of the print-ready stencil.

In accordance with a feature of the invention, finest image details can be reproduced, independent of the fineness of the grid material itself.

Figure 10:
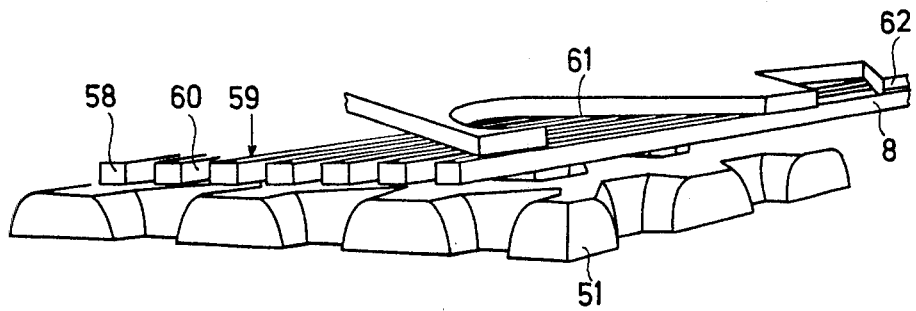
FIG. 10 is a perspective view of a grid stencil with a stencil layer having a fine raster.

Referring to FIG. 10, a grid or screen material 51 of any predetermined fine, or coarse mesh size is used and, as above described, is filled with filler material so that the grid lines are blank, but the interstices are completely filled, so that the grid with filler material forms a smooth continuous surface. In a second process step, a suitable pattern carrier is used, for example one of the known photo emulsions which can be hardened, to copy a line raster on the smooth surface. This raster is developed and hardened. The pattern to be composed, and then to be printed is carried out in a third step, analogous to the second. The stencil surface which now has projecting grid lines has a suitable lacquer applied thereto, to fill the spaces between the grid lines. This lacquer is then removed, for example by grinding or buffing until the raster lines 58 of the pattern are free at their upper surfaces 59 of any filler lacquer; the interstices 60, however, between the pattern lines 58 are filled and, together with the filling, form a smooth surface.

The printing stencil which is so prepared then has the hardened photo emulsion applied therover, which is exposed, in accordance with the steps explained in connection with FIG. 4, and the hardened photo emulsion is then developed, dried and hardened. The last stencil layer 62 (FIG. 10) then defines therebetween the open spaces 61 of the print stencil, where printing is to take place. In a last step, the filler lacquer is washed out by a suitable solvent.

The dimensioning of the line raster 58, that is, the auxiliary pattern, as well as the distance of the lines from each other depend on the photographic resolving power of the stencil material which is to be used. Within the limits given by the stencil material, thin and high raster lines define a large quantity of ink available for printing; flat and wide raster lines provide only little printing ink. In order to change the relationship of ink available for printing, that is, to match the printing form to the substrate on which the printing is to be carried out, the thickness of the stencil layer, that is, of the first grid pattern, can be changed by changing the thickness of the layer of which the grid pattern is made, and the pattern itself can be suitably varied, by selectively using different photographic patterns.

Figure 11:
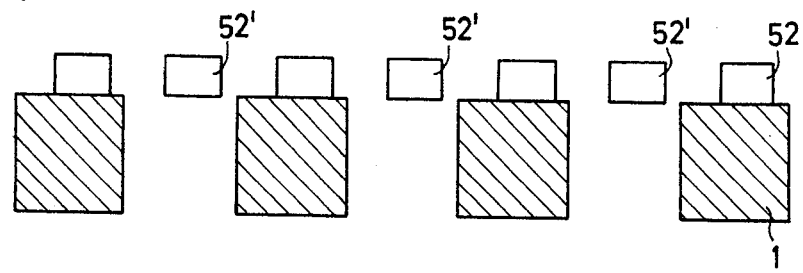
FIG. 11 is a cross-sectional view, in highly schematic form, through a stencil having a fine raster.

The line raster, which is photographically applied, can thus be changed to control the volume of printing ink, and thus to vary the base stencil on which the image is composed. This line raster may have a further function. It may be desired, for example, to reproduce details which are smaller than the free width of the interstices of the screen. In accordance with the usual methods, these details, when exposed on the screen and if they are on a screen opening, could not initially have any connection with the underlying screen material, thus, could not be secured thereto. As illustrated in FIG. 11, details 52', if they were to be reproduced, are not secured to the underlying grid material, schematically indicated at 1, and corresponding to the grid 51 of FIG. 10. These elements 52' would thus fall through the interstices between the grids. In irregularly arranged details, the reproduction of the composed image would thus be different from the image actually exposed. In regularly recurring patterns, for example in cross rasters, a moire effect would invariably result.

In accordance with the described embodiment, these effects can be avoided. It is only necessary to make the line raster of the first, lower pattern on the stencil so fine that even the finest details of the image to be composed will find support on the underlying grid pattern.

Figure 12:
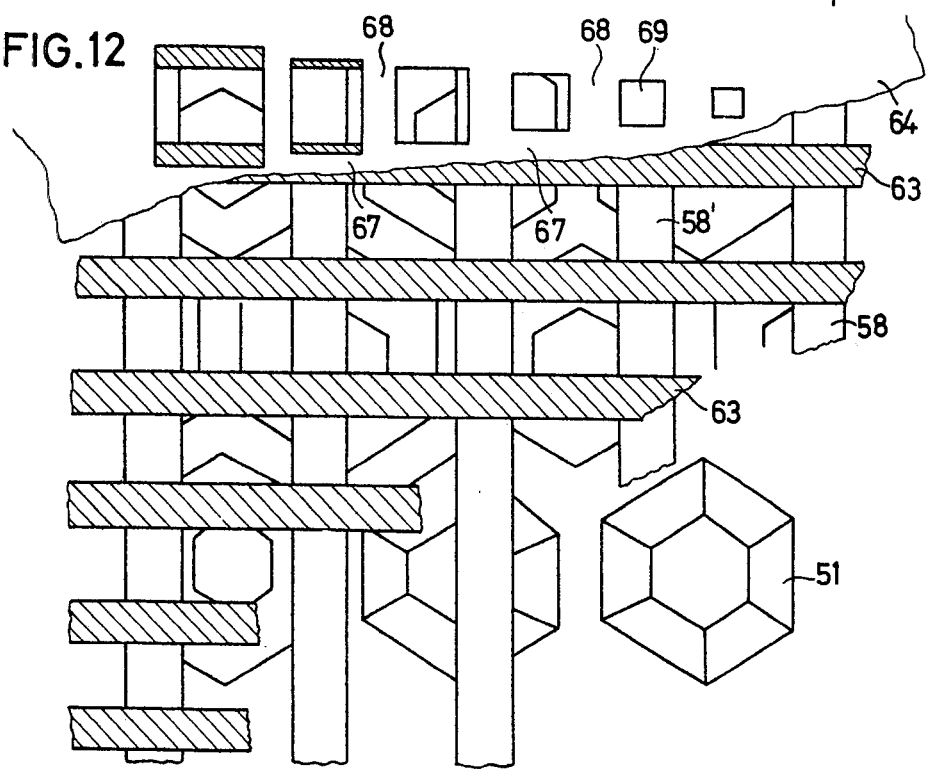
FIG. 12 is a schematic top view of a stencil with a pattern or composing layer, partly broken away, and in which rasters on stencil layers of different fineness have been applied.

FIG. 12 illustrates the combination of a photographically resolved image, broken up into a 60-line raster which can be combined with a 32-line raster (80 mesh) screen, without being subjected to a moire effect.

The filled screen material 51 first has a first line raster 58, for example at 40 lines per centimeter applied thereto. Thereafter, and in accordance with the previously described process steps, a second line raster 63 of, for example, 60 lines per centimeter and arranged at an angle of, for example, approximately 90° with the first line raster, is applied. A third layer 64 of the stencil material is then applied; the image is composed over the raster of the last stencil material layer, in this instance, in a 60-mesh cross raster. Of course, the structure of the last preceding line raster 63 previously was levelled, so that the next layer could be applied thereto; the structure of the first line raster 58 also previously had been ground or flattened or levelled. The cross raster, with horizontal grid lines 67 and vertical row lines 68 is so arranged on the last preceding line raster therebeneath that the ink impervious, horizontal line rasters 67 of the cross raster always fall on the lines of the second line raster 63 which are immediately therebeneath. The vertical row lines 68 of the cross raster are freely self-supporting.

Some raster opening 69 may fall in the region of a raster line 58' of the first stencil layer 58. This is immaterial. The ink which is supplied during printing fills the line raster system which, in this embodiment, has three layers of material. In view of the raster grid lines 58, 63, it can enter the raster opening 69 of the last stencil layer 64 due to the interstices, even those which are apparently covered. As a result, a screen printing system is developed which, in the light of the state of the art, provides an extremely fine break-up of the image to be reproduced, by providing a very fine cross raster therefor.

The actual layer which is formed in accordance with the image is not applied to the basic grid raster, but rather on layers of material which themselves are formed in a raster stencil, before the final layer on which the composition is imaged, has been applied. Thus, the amount of ink which is needed can be accurately controlled by controlling the so-called ink volume of the raster, or underlying screen in accordance with design requirements, that is, by forming the underlying rasters at spacings and in arrangements to match the ink which is needed. Further, by the combination of various rasters, the detail of the image to be reproduced becomes essentially independent of at least the bottom-most of the underlying grid layers, and the detail of the image to be reproduced can thus approach the limits of the photographic resolving capacity of the stencil material. The detail is thus independent of the material and grid raster size of the basic grid and screen or grid printing of color tones or scale which are resolved into a broken-up image can be obtained, without a moire effect.

Figure 13:
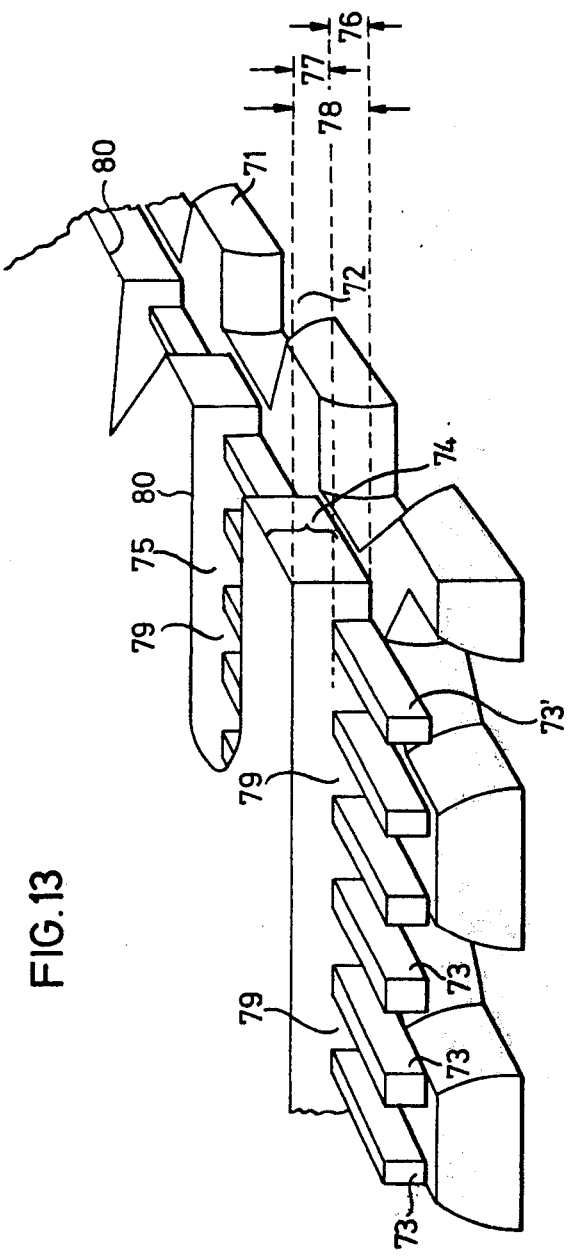
FIG. 13 is a perspective view of a stencil with two photo-sensitive layers, in which the second layer is the composed layer.

In accordance with the process described in connection with FIGS. 10 to 12, the first light-sensitive layer is exposed and then processed, by developing, hardening, and the like before the second light-sensitive layer is applied thereover. This process can be simplified in that the first light-sensitive layer is not completed, that is, is not developed and hardened and, likewise, preparation of the first light-sensitive layer by filling with filler material and subsequent flat grinding and polishing is not done before application of a second photosensitive layer. Rather, after exposure of the first light-sensitive layer, a second stencil material layer is applied thereover. This substantially reduces rejects and errors, as well as work time and material and thus results in lower costs. The printing shoulder is formed in somewhat simpler manner than in the process in accordance with FIGS. 10 to 12, and the ink penetration of the screen grid material can be limited. This modification of the process is illustrated in connection with FIG. 13.

A base screen having grids 71, with openings 72 therebetween is the base material, filled with a filler in such a manner that, on the one hand, the grid raster lines are not covered and, on the other, the grid openings are completely filled. In other words, the initial filler is applied to the base grid which is then ground or polished to a smooth surface.

In a second stage of the process, the smooth flat grid material, with the interstices filled, has a photo-sensitive stencil layer applied thereto, which is then dried. This stencil layer is exposed through a mask which may only show lines, that is, through a line-ruled mask, negative, or slide. In a third step of the process, the now exposed stencil material layer has a second photo-sensitive stencil material layer 75 applied thereto. Since the underlying surface is flat and smooth, the second stencil material layer 75 will likewise be flat and smooth.

The second stencil material layer 75 is then exposed through an image negative, which carries the composition to be applied to the screen grid. In a fourth stage, the second layer 75 is exposed which, again, also exposes those portions of the first photo-sensitive layer which receive light through the slide or negative carrying the composition, and which were not exposed during the first exposure. The already exposed portions, however, which are again exposed by the second exposure receive twice the light; this is no disadvantage when the known and easily polymerized photo emulsions are used.

In a last step of the process, the entire stencil material is developed, hardened, and thereafter the filler material in the interstices 72 is removed, so that the final printing screen or grid is finished.

The line raster 73 permits reduction of the ink penetration in the grid material, as desired. The dimension of the remaining lines 73' (FIG. 13) can be changed, and the thickness of the layer of these line rasters, indicated at 76, can likewise be changed, to provide a controllable reservoir for ink. The width of the lines of the line raster, and their orientation of course is determined by the mask which is used for its exposure; the thickness by the thickness of the photo-sensitive layer. The second photo-sensitive layer 75 has a thickness indicated at 77 (FIG. 13) which again can be varied as desired. It is applied on the exposed first layer, the two photo-sensitive layers having a combined thickness indicated at 78. The difference in height 77 of the second light-sensitive layer 75 with respect to the thickness 76 of the first layer 73 provides for the desired shoulder 80 at the edges of the image.

Exposure of the second layer 75 over the image carrying negative exposes all regions 79 of the first photo-sensitive layer 73, which were not provided to permit ink to penetrate in the first place. By this exposure, the stable and sturdy interconnection of the two layers, as indicated at 74, will result, both with respect to each other as well as with respect to the underlying grid material. Good stability is obtained also on the bridge points of the raster opening 72.

The substance which has been referred to as filler, or filler lacquer, to be used in the present invention must have these characteristics: ease of application by usual application techniques; non-foaming; hardening and capability to be ground or polished by utilization of usual and customarily available grinding and polishing techniques; non-solubility in water; freedom from shrinking, also over longer periods of time (12 months and longer); freedom from shrinking over short periods of time upon heating, for example in the region of 200° C, and for periods of from 3–4 hours; good adhesion to the usual grid or screen materials utilized in rotary screen printing technology, particularly nickel, and independent of aging and temperature up to 200° C; low thermoplastic flow, even if heated to temperatures to 200° C; good solubility before and after heat treatment in solvents which do not attack the polymerized layer; chemical resistance with respect to usually used etching solutions, such as ferrous chloride, and, additionally, nonpoisonous in use. Such a substance having the required characteristics are known as Plusodur 230, 60% Xylol, hardened with Maprenal RT, in a mixture of about 9 parts Plusodur 230 and 1 part Maprenal RT (by weight). As solvents, ketones and esters can be used.

The invention has been described particularly in connection with rotary stencils for rotary presses, but can be used equally for flatbed presses and flatbed stencils.

Various changes and modifications may be made within the scope of the inventive concept.

I claim:

1. Method to make stencils having a stencil layer on printing grids having interstices between the grid lattice thereof, in which a photo-sensitive layer is utilized to be exposed in accordance with an image to be composed or printed, the non-exposed image portions being removed before printing, the method comprising forming a level, smooth continuous composite surface of exposed grid lattice and a soluble filler located only in the interstices between the grid lattice, by applying a filler material over a side of the printing grid, and penetrating the interstices between the lattice of the grid and removing that portion of the filler material which extends over the printing grid to leave a smooth surface of grid lattice and intersticial filler material;

applying a continuous single photo-sensitive layer of sufficient thickness to form the stencil directly over the smooth surface of the exposed grid lattice and the filler in the interstices between the lattice with constant, controllable thickness, exposing the photosensitive layer with the image to be composed;

selectively removing a portion of the layer of photo-sensitive material in accordance with the image to which the layer was exposed to develop the exposed photo-sensitive layer;

and thereafter removing all the filler material by a solvent.

2. Method according to claim 1, for reproduction of fine details or lines, comprising the step of forming said printing grid of metal and etching the side of the grid which has the photo-sensitive layer applied with an etch attacking the grid but not said photo-sensitive layer until sufficient grid material is etched away from the portion of the grid beneath the line or detail, to form a connection beneath the photo-sensitive layer with an adjacent interstice.

3. Method according to claim 1, further comprising the step of applying a lacquer to the side of the grid remote from the side covered by the photo-sensitive layer;

and removing excess lacquer by suction from the side of the photo-sensitive layer of the screen while the lacquer is still in flowable condition.

4. Method to make stencils having a stencil layer on printing grids having interstices between the grid lattice thereof, in which a photo-sensitive layer is utilized to be exposed in accordance with an image to be composed or printed, the non-exposed image portions being removed before printing, the method comprising forming a level, smooth continuous composite surface of exposed grid lattice and a soluble filler located only in the interstices between the grid lattice, by filling only the interstices between the lattice grid with the filler, said filler being a material removable from the grid lattice independently of the photo-sensitive layer;

applying a continuous single photo-sensitive layer of sufficient thickness to form the stencil directly over the smooth surface of the exposed grid lattice and the filler in the interstices between the lattice with constant, controllable thickness;

exposing the photo-sensitive layer with the image to be composed;

selectively removing a portion of the layer of photo-sensitive material in accordance with the image to which the layer was exposed to develop the exposed photo-sensitive layer while leaving substantially all of the filler material in place;

and thereafter removing all the filler material by a solvent.

5. Method according to claim 4, for reproduction of fine details or lines, comprising the step of forming said printing grid of metal and etching the side of the grid which has the photo-sensitive layer applied with an etch attacking the grid but not said photo-sensitive layer until sufficient grid material is etched away from the portion of the grid beneath the line or detail, to form a connection beneath the photo-sensitive layer with an adjacent intersticee.

6. Method according to claim 4, further comprising the step of applying a lacquer to the side of the grid remote from the side covered by the photo-sensitive layer;

and removing excess lacquer by suction from the side of the photo-sensitive layer of the screen while the lacquer is still in flowable condition.

\* \* \* \* \*